US011910583B2

(12) United States Patent
Wu

(10) Patent No.: US 11,910,583 B2
(45) Date of Patent: Feb. 20, 2024

(54) ELECTROMAGNETIC WAVE ABSORPTION STRUCTURE

(71) Applicant: Black solution Nanotech Co., Ltd., Taipei (TW)

(72) Inventor: Feng-Yu Wu, Taipei (TW)

(73) Assignee: BLACK SOLUTION NANOTECH CO., LTD., Taipei (TW)

( * ) Notice: Subject to any disclaimer, the term of this patent is extended or adjusted under 35 U.S.C. 154(b) by 0 days.

(21) Appl. No.: 17/406,586

(22) Filed: Aug. 19, 2021

(65) Prior Publication Data
US 2022/0104408 A1 Mar. 31, 2022

(30) Foreign Application Priority Data
Sep. 30, 2020 (TW) .................................. 109134116

(51) Int. Cl.
*H05K 9/00* (2006.01)
*B32B 9/00* (2006.01)
*H01Q 17/00* (2006.01)

(52) U.S. Cl.
CPC ........... *H05K 9/0084* (2013.01); *B32B 9/007* (2013.01); *H01Q 17/002* (2013.01); *H05K 9/009* (2013.01); *H05K 9/0088* (2013.01); *B32B 2250/42* (2013.01); *B32B 2307/206* (2013.01); *B32B 2307/212* (2013.01); *B32B 2307/732* (2013.01); *B32B 2571/00* (2013.01)

(58) Field of Classification Search
CPC ................................................... H05K 9/0088
See application file for complete search history.

(56) References Cited

U.S. PATENT DOCUMENTS

| | | | | |
|---|---|---|---|---|
| 2004/0219328 A1* | 11/2004 | Tasaki | ..................... | C22C 38/14 427/127 |
| 2011/0186324 A1* | 8/2011 | Hur | ....................... | H05K 9/0098 174/391 |
| 2012/0225269 A1 | 9/2012 | Bedjukh | | |
| 2014/0174813 A1* | 6/2014 | Doneker | ................ | H05K 9/009 174/358 |
| 2020/0214181 A1 | 7/2020 | Yamagata et al. | | |

FOREIGN PATENT DOCUMENTS

| TW | 201018387 A | 5/2010 |
|---|---|---|
| TW | 202017743 A | 5/2020 |

OTHER PUBLICATIONS

Danlée Yann et al., "Thin and flexible multilayer polymer composite structures for effective control of microwave electromagnetic absorption", Composites Science and Technology, Jun. 18, 2014 (Jun. 18, 2014), pp. 182-188, vol. 100, Elsevier, Amsterdam, NL, XP029040500, ISSN:0266-3538, DOI:10.1016/J.COMPSCITECH.2014.06.010.

* cited by examiner

*Primary Examiner* — Hung V Ngo
(74) *Attorney, Agent, or Firm* — Muncy, Geissler, Olds & Lowe, P.C.

(57) ABSTRACT

An electromagnetic wave absorption structure includes at least one electromagnetic wave composite absorbing layer. The electromagnetic wave composite absorbing layer includes a conductive composite layer and an insulating layer. The insulating layer is stacked and overlapped with the conductive composite layer. The electromagnetic wave absorption structure can provide good electromagnetic wave absorption function, and have the features of light and thin, so it is particularly suitable for satisfying the electromagnetic wave absorption or shielding requirements of thin electronic products.

20 Claims, 2 Drawing Sheets

ELECTROMAGNETIC WAVE ABSORPTION STRUCTURE

CROSS REFERENCE TO RELATED APPLICATIONS

This Non-provisional application claims priority under 35 U.S.C. § 119(a) on Patent Application No(s). 109134116 filed in Taiwan, Republic of China on Sep. 30, 2020, the entire contents of which are hereby incorporated by reference.

BACKGROUND

Technology Field

The present disclosure relates to an absorption structure and, in particular, to an electromagnetic wave absorption structure and an electronic device having the same.

Description of Related Art

Generally speaking, the electromagnetic wave radiation has lower energy, so it can not cause the dissociation of substances, nor can it directly damage environmental substances. However, in the current modern life relying on various electronic equipment, supplies, and devices, electromagnetic interference is an unignorable issue, which may interfere the normal operation of electronic devices and may also expose people to the harmful situation at any time. For example, after using a mobile phone or computer for a long time, people may feel physical fatigue, eye fatigue, shoulder pain, headache, sleepy, and restlessness, all of which may be caused by electromagnetic waves. Moreover, electromagnetic waves can also reduce human immune function and reduce calcium in the human body, and may cause some symptoms or diseases, such as miscarriage, visual disturbance, and interference to cell division (e.g. cancer, leukemia, brain tumors, etc.).

SUMMARY

An objective of this disclosure is to provide an electromagnetic absorption structure and an electronic device having the same. The electromagnetic wave absorption structure and electronic device can provide good electromagnetic wave absorption function, and have the features of light and thin, so they are particularly suitable for satisfying the electromagnetic wave absorption or shielding requirements of thin electronic products.

To achieve the above, an electromagnetic wave absorption structure of this disclosure comprises at least one electromagnetic wave composite absorbing layer. The electromagnetic wave composite absorbing layer comprises a conductive composite layer and an insulating layer, which is stacked and overlapped with the conductive composite layer.

To achieve the above, an electromagnetic wave absorption structure of this disclosure comprises at least two electromagnetic wave composite absorbing layers, which are stacked and overlapped with each other. Each electromagnetic wave composite absorbing layer comprises a conductive composite layer and an insulating layer, which is stacked and overlapped with the conductive composite layer.

In one embodiment, the thickness of the electromagnetic wave absorption structure is between 5 μm and 5000 μm.

In one embodiment, the thickness of the conductive composite layer is between 1 μm and 100 μm.

In one embodiment, the thickness of the insulating layer is between 0.1 μm and 200 μm.

In one embodiment, the conductive composite layer comprises a plurality of conductive layers and a plurality of interlayer insulating layers, and the conductive layers and the interlayer insulating layers are stacked in a staggered manner.

In one embodiment, amounts of the conductive layers and the interlayer insulating layers in the conductive composite layer are different.

In one embodiment, the conductive layer is a graphene layer, a graphite layer, a graphite nanoplatelet layer, a carbon fiber layer, or a carbon nanotube layer.

In one embodiment, the thickness of the conductive layer is between 5 nm and 200 nm.

In one embodiment, the thickness of the interlayer insulating layer is between 5 nm and 10000 nm.

In one embodiment, the insulating layer or the interlayer insulating layer is a polymer resin layer, a resin/ceramic mixture layer, or a resin/metal mixture layer.

In one embodiment, the sheet resistance of the conductive layer is between 10 ohm per square and 1000 ohm per square.

To achieve the above, this disclosure also provide an electronic device comprising the above-mentioned electromagnetic wave absorption structure.

As mentioned above, the electromagnetic wave absorption structure of this disclosure comprises at least one electromagnetic wave composite absorbing layer, and the electromagnetic wave composite absorbing layer comprises a conductive composite layer and an insulating layer, which is stacked and overlapped with the conductive composite layer. Alternatively, the electromagnetic wave absorption structure of this disclosure comprises at least two electromagnetic wave composite absorbing layer, and each electromagnetic wave composite absorbing layer comprises a conductive composite layer and an insulating layer, which is stacked and overlapped with the conductive composite layer. According to the configuration and structural design of this disclosure, the electromagnetic wave absorption structure and electronic device having the same can provide good electromagnetic wave absorption function, and have the features of light and thin, so they are particularly suitable for satisfying the electromagnetic wave absorption or shielding requirements of thin electronic products.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1:
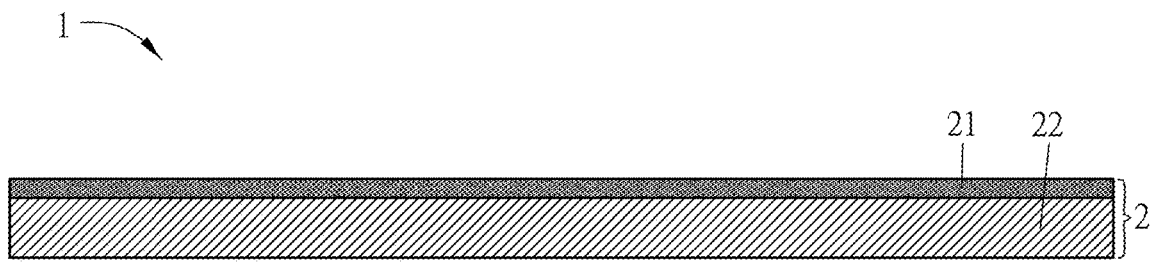
FIG. 1 is a schematic diagram showing an electromagnetic wave absorption structure according to an embodiment of this disclosure.
Figure 2:
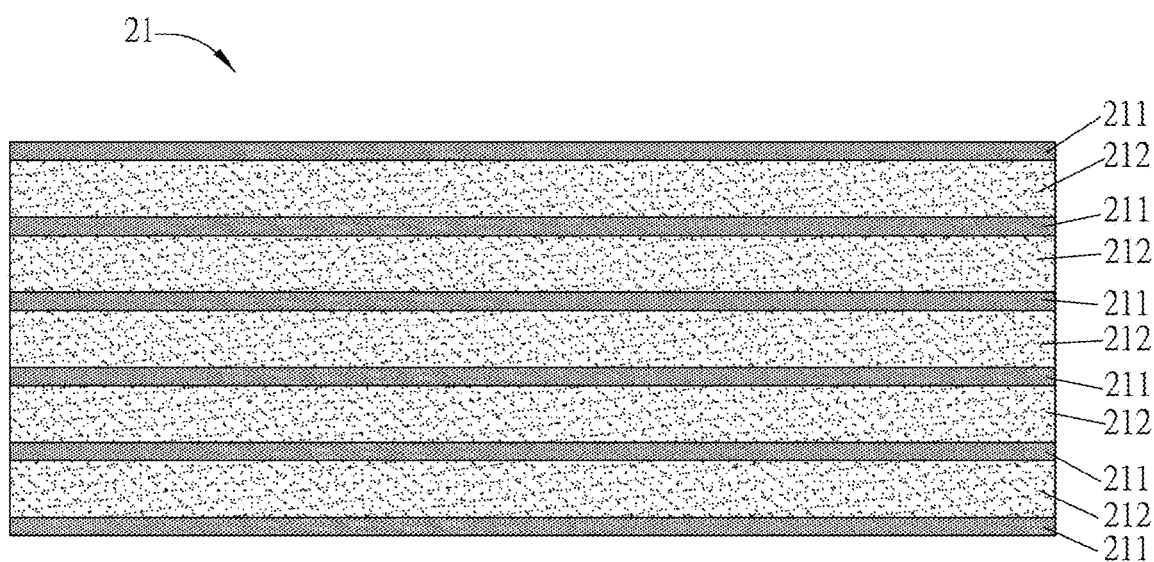
FIG. 2 is an enlarged view of the electromagnetic wave composite absorbing layer of the electromagnetic wave absorption structure as shown in FIG. 1.
Figure 3:
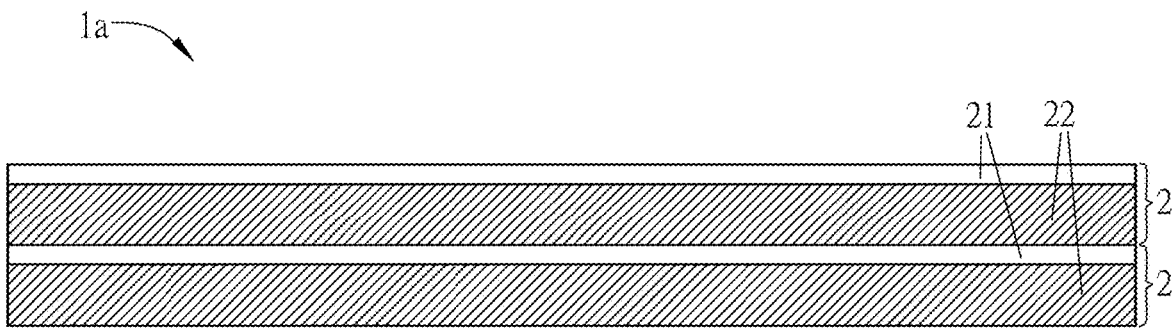
FIGS. 3 and 4 are schematic diagrams showing electromagnetic wave absorption structures according to different embodiments of this disclosure.
Figure 4:
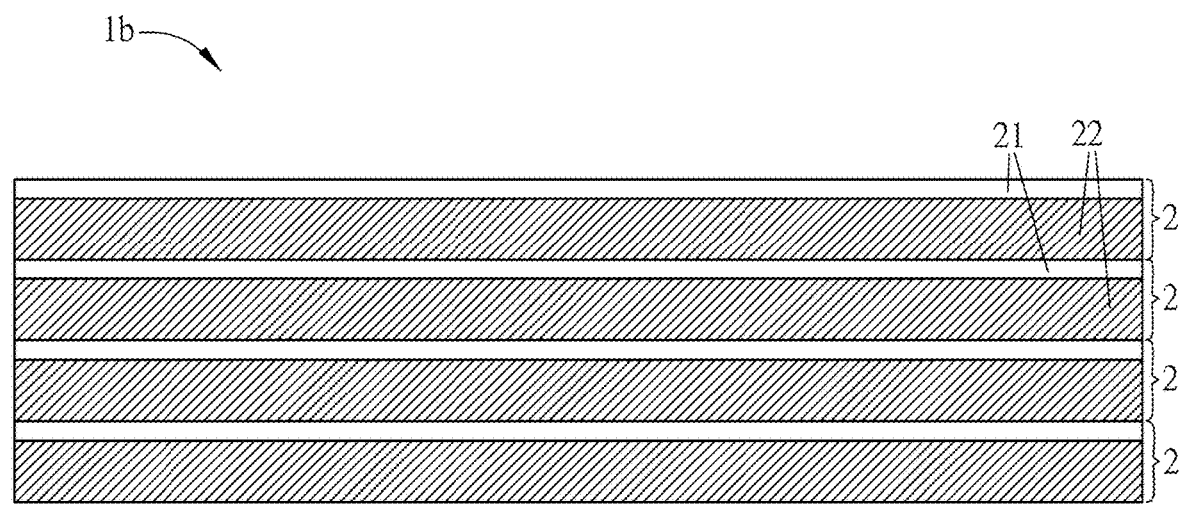

FIG. 1 is a schematic diagram showing an electromagnetic wave absorption structure according to an embodiment of this disclosure, FIG. 2 is an enlarged view of the electromagnetic wave composite absorbing layer of the electromagnetic wave absorption structure as shown in FIG. 1, and FIGS. 3 and 4 are schematic diagrams showing electromagnetic wave absorption structures according to different embodiments of this disclosure.

Referring to FIG. 1, the electromagnetic absorption structure 1 comprises at least one electromagnetic wave composite absorbing layer 2. For example, the electromagnetic absorption structure 1 of this embodiment comprises one electromagnetic wave composite absorbing layer 2. In other embodiments, the amount of the electromagnetic wave composite absorbing layer 2 can be greater than one, such as two, three, four, or more, and the multiple electromagnetic wave composite absorbing layers 2 are stacked and overlapped with each other. This disclosure does not particularly limit the number of the stacked electromagnetic wave composite absorbing layers 2, and the number of the stacked electromagnetic wave composite absorbing layers 2 can be determined based on the required electromagnetic wave absorption effect and thickness. In general, the more electromagnetic wave composite absorbing layers 2 are configured, the better absorption effect can be provided. In some embodiments, the thickness of the electromagnetic wave absorption structure 1 is between 5 μm and 5000 μm (including 5 μm and 5000 μm). Accordingly, the electromagnetic wave absorption structure 1 has the features of light and thin, and it is particularly suitable for satisfying the electromagnetic wave absorption or shielding requirements of thin electronic products.

The electromagnetic wave composite absorbing layer 2 comprises a conductive composite layer 21 and an insulating layer 22, which is stacked and overlapped with the conductive composite layer 21. In some embodiments, the thickness of the conductive composite layer 21 is between 1 μm and 100 μm (including 1 μm and 100 μm), and the thickness of the insulating layer 22 is between 0.1 μm and 200 μm (0.1 μm≤the thickness of the insulating layer 22≤200 μm). For example, the thickness of the insulating layer 22 is 0.1 μm or 30 μm.

As shown in FIG. 2, the conductive composite layer 21 of this embodiment comprises a plurality of conductive layers 211 and a plurality of interlayer insulating layers 212. In this embodiment, the conductive composite layer 21 comprises six conductive layers 211 and five interlayer insulating layers 212, and each interlayer insulating layer 212 is sandwiched between two adjacent conductive layers 211. That is, the conductive layers 211 and the interlayer insulating layers 212 are stacked in a staggered manner (one conductive layer 211/one interlayer insulating layer 212/one conductive layer 211/ . . . /one conductive layer 211/one interlayer insulating layer 212/one conductive layer 211). In this embodiment, the amount of the conductive layers 211 is different from the amount of the interlayer insulating layers 212. However, in other embodiments, the amount of the conductive layers 211 can be equal to the amount of the interlayer insulating layers 212, and the conductive layers 211 and the interlayer insulating layers 212 are still stacked in a staggered manner. In addition, the same kind of sublayers in the conductive composite layer 21 (e.g. the conductive layers 211 or the interlayer insulating layers 212) can be formed with the same thickness or partially different thicknesses, or can be made of the same material or partially different materials. This disclosure is not limited.

In some embodiments, the sheet resistance of the conductive layer 211 is between 10 ohm per square (Ohm/sq) and 1000 ohm per square (Ohm/sq), the thickness of the conductive layer 211 is between 5 nm and 200 nm (5 nm≤the thickness of conductive layer 211≤200 nm), and the thickness of the interlayer insulating layer 212 is between 5 nm and 10000 nm.

The above-mentioned conductive layer 211 comprises a conductive material, such as graphene, graphite, graphite nanoplatelet, carbon fiber, carbon nanotube, or any combination thereof. In other words, the conductive layer 211 can be a graphene layer, a graphite layer, a graphite nanoplatelet layer, a carbon fiber layer, or a carbon nanotube layer, or a layer made of any combinations of the above materials including graphene, graphite, graphite nanoplatelet, carbon fiber, and carbon nanotube. In this embodiment, since the materials, including graphene, graphite, graphite nanoplatelet, carbon fiber, and carbon nanotube, have good electromagnetic wave absorption ability, so that the conductive layer 211 can also have good electromagnetic wave absorption effect. As a result, the conductive composite layer 21 can have good electromagnetic wave absorption effect, too.

In addition, the insulating layer 22 or the interlayer insulating layer 212 can be a polymer resin layer, which is made of, for example but not limited to, epoxy resin, acrylic resin, polyurethane resin, wax, or any combination thereof, or any of other polymer resin materials. In some embodiments, the insulating layer 22 or the interlayer insulating layer 212 may also be a resin/ceramic mixture layer. Specifically, the material of the resin/ceramic mixture layer may include a polymer resin and ceramic powder. That is, the ceramic powder is mixed with the polymer resin to form the resin/ceramic mixture layer. The ceramic powder can be, for example but not limited to, alumina ($Al_2O_3$) ceramic powder, iron oxide ($Fe_2O_3$) ceramic powder, boron nitride (BN) ceramic powder, aluminum nitride (AlN) ceramic powder, silicon nitride ($Si_3N_4$) ceramic powder, or any combination thereof. In some embodiments, the insulating layer 22 or the interlayer insulating layer 212 may also be a resin/metal mixture layer. Specifically, the metal powder or metal powder that has undergone insulation treatment (i.e., the metal powder is formed with an insulating coating) can be mixed in the polymer resin to form a resin/metal mixture layer. Herein, the material of the metal powder can be, for example but not limited to, gold, aluminum, copper, nickel, palladium, platinum, zinc, silver, alloy materials (e.g. iron-silicon alloy, iron-silicon-aluminum alloy, or iron-silicon-chromium alloy, or any combination thereof. By adding ceramic powder, metal powder or metal powder that has undergone insulation treatment into the polymer resin, the insulating layer 22 or the interlayer insulating layer 212 can also have electromagnetic wave absorption effect.

In addition, the configurations and connections of components of the electromagnetic wave absorption structure 1a of this embodiment as shown in FIG. 3 are mostly the same as those of the electromagnetic wave absorption structure 1 of the previous embodiment. Different from the previous embodiment, the electromagnetic wave absorption structure 1a of this embodiment comprises at least two electromagnetic wave composite absorbing layers 2, which are stacked and overlapped with each other. In this embodiment, for example, the electromagnetic wave absorption structure 1a comprises two electromagnetic wave composite absorbing layers 2, which are stacked and overlapped with each other. In other embodiments, the amount of the electromagnetic wave composite absorbing layers 2 arranged in the electromagnetic wave absorption structure 1a can be more than two and less than or equal to ten. For example, the electromagnetic wave absorption structure may comprise three or more electromagnetic wave composite absorbing layers 2, which are stacked and overlapped with each other. The amount of the stacked electromagnetic wave composite absorbing layers 2 in the electromagnetic wave absorption structure is not limited, and it can be designed based on the required electromagnetic wave absorption effect.

Each electromagnetic wave composite absorbing layer 2 comprises a conductive composite layer 21 and an insulating layer 22, which is stacked and overlapped with the conductive composite layer 21. Herein, the same kind of sublayers in two electromagnetic wave composite absorbing layers 2 can be the same or different. For example, the two conductive composite layers 21 of two electromagnetic wave composite absorbing layers 2, respectively, can be made of the same material or different materials, and the thicknesses thereof can be the same or different. Similarly, the two insulating layers 22 of two electromagnetic wave composite absorbing layers 2, respectively, can be made of the same material or different materials, and the thicknesses thereof can be the same or different. This disclosure is not limited, and the configuration of these layers can be determined based on the actual requirement.

The configurations and connections of components of the electromagnetic wave absorption structure 1b of this embodiment as shown in FIG. 4 are mostly the same as those of the electromagnetic wave absorption structure 1 or 1a of the previous embodiments. Different from the previous embodiments, the electromagnetic wave absorption structure 1b of this embodiment comprises four electromagnetic wave composite absorbing layers 2, which are stacked and overlapped with each other.

In addition, the technical contents of the conductive composite layer 21 and the insulating layer 22 of the electromagnetic wave composite absorbing layer 2 and the conductive layers 211 and the interlayer insulating layers 212 of the conductive composite layer 21 in the electromagnetic wave absorption structure 1a or 1b can refer to the same components of the electromagnetic wave absorption structure 1 according to the previous embodiment, so the detailed descriptions thereof will be omitted.

The electromagnetic wave absorption structures according to different embodiments of this disclosure will be further described hereinafter.

In a first embodiment, the material of the conductive layer 211 comprises graphene (i.e., the conductive layer 211 is a graphene layer), and the thickness thereof is 100 nm. The thickness of the interlayer insulating layer 212 is 500 nm, and the material thereof comprises acrylic resin (i.e., the interlayer insulating layer 212 is an acrylic resin layer). 50 conductive layers 211 and 50 interlayer insulating layers 212 are stacked in a staggered manner to form a conductive composite layer 21 with a thickness of 30 μm. In addition, the thickness of the insulating layer 22 is 10 μm, and the material thereof comprises acrylic resin (i.e., the insulating layer 22 is an acrylic resin layer). Afterwards, the conductive composite layer 21 (30 μm) and the insulating layer 22 (10 μm) are stacked to form one electromagnetic wave composite absorbing layer 2, and three electromagnetic wave composite absorbing layers 2 are stacked and overlapped to obtain an electromagnetic wave absorption structure with a total thickness of 120 μm.

In a second embodiment, the material of the conductive layer 211 comprises graphene (i.e., the conductive layer 211 is a graphene layer), and the thickness thereof is 10 nm. The thickness of the interlayer insulating layer 212 is 50 nm, and the material thereof comprises epoxy resin (90%) mixed with boron nitride (10%) (i.e., the interlayer insulating layer 212 is a resin/ceramic mixture layer). 100 conductive layers 211 and 100 interlayer insulating layers 212 are stacked in a staggered manner to form a conductive composite layer 21 with a thickness of 6 μm. In addition, the thickness of the insulating layer 22 is 50 μm, and the material thereof comprises epoxy resin (70%) mixed with iron oxide (30%) (i.e., the insulating layer 22 is a resin/ceramic mixture layer). Afterwards, the conductive composite layer 21 (6 μm) and the insulating layer 22 (50 μm) are stacked to form one electromagnetic wave composite absorbing layer 2, and five electromagnetic wave composite absorbing layers 2 are stacked and overlapped to obtain an electromagnetic wave absorption structure with a total thickness of 280 μm.

Moreover, this disclosure further provides an electronic device, which comprises any of the above-mentioned electromagnetic wave absorption structures 1, 1a and 1b, or any of their modifications. To be noted, the specific technical contents of the electromagnetic wave absorption structure 1, 1a or 1b, or any of their modifications can refer to the above embodiments, so the detailed descriptions thereof will be omitted.

The electromagnetic wave absorption structure can be used to absorb the electromagnetic waves emitted by the components of electronic device to prevent excessive electromagnetic noise from interfering with other devices. In addition, the electromagnetic wave absorption structure can absorb the electromagnetic waves incident to the electronic device from the outside to avoid affecting the normal functions of the electronic device. Moreover, the electromagnetic wave absorption structure can reduce the intensity of the electromagnetic wave from the outside, so that the electronic device can pass the safety standard inspection withstanding the external electromagnetic waves. The above-mentioned electronic device may be a portable or fixed electronic device (e.g. a mobile phone, a tablet computer, a notebook computer, a wearable device, or the like), or the internal component, unit, or module of the aforementioned portable or fixed electronic device. This disclosure is not limited.

In summary, the electromagnetic wave absorption structure of this disclosure comprises at least one electromagnetic wave composite absorbing layer, and the electromagnetic wave composite absorbing layer comprises a conductive composite layer and an insulating layer, which is stacked and overlapped with the conductive composite layer. Alternatively, the electromagnetic wave absorption structure of this disclosure comprises at least two electromagnetic wave composite absorbing layer, and each electromagnetic wave composite absorbing layer comprises a conductive composite layer and an insulating layer, which is stacked and overlapped with the conductive composite layer. According to the configuration and structural design of this disclosure, the electromagnetic wave absorption structure and electronic device having the same can provide good electromagnetic wave absorption function, and have the features of light and thin, so they are particularly suitable for satisfying the electromagnetic wave absorption or shielding requirements of thin electronic products.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electromagnetic wave absorption structure, comprising:
   at least one electromagnetic wave composite absorbing layer;
   wherein the electromagnetic wave composite absorbing layer comprises a conductive composite layer and an insulating layer, and the insulating layer is stacked and overlapped with the conductive composite layer,
   wherein the conductive composite layer comprises a plurality of conductive layers and a plurality of interlayer insulating layers, and the conductive layers and the interlayer insulating layers are stacked in a staggered manner,
   wherein the conductive layer is a graphene layer, a graphite layer, a graphite nanoplatelet layer or a carbon nanotube layer, and
   wherein the insulating layer or one of the interlayer insulating layers is a resin/ceramic mixture layer being formed by a ceramic powder mixed into a polymer resin, or a resin/metal mixture layer being formed by a metal powder or the metal powder that has undergone insulation treatment mixed into a polymer resin.

2. The electromagnetic wave absorption structure of claim 1, wherein a thickness of the electromagnetic wave absorption structure is between 5 μm and 5000 μm.

3. The electromagnetic wave absorption structure of claim 1, wherein a thickness of the conductive composite layer is between 1 μm and 100 μm.

4. The electromagnetic wave absorption structure of claim 1, wherein a thickness of the insulating layer is between 0.1 μm and 200 μm.

5. The electromagnetic wave absorption structure of claim 1, wherein amounts of the conductive layers and the interlayer insulating layers in the conductive composite layer are different.

6. The electromagnetic wave absorption structure of claim 1, wherein a thickness of the conductive layer is between 5 nm and 200 nm.

7. The electromagnetic wave absorption structure of claim 1, wherein a thickness of the interlayer insulating layer is between 5 nm and 10000 nm.

8. The electromagnetic wave absorption structure of claim 1, wherein a sheet resistance of the conductive layer is between 10 ohm per square and 1000 ohm per square.

9. The electromagnetic wave absorption structure of claim 1, wherein the electromagnetic wave absorption structure comprises at least two electromagnetic wave composite absorbing layers stacked and overlapped with each other.

10. The electromagnetic wave absorption structure of claim 9, wherein amounts of the conductive layers and the interlayer insulating layers in the conductive composite layer are different.

11. An electromagnetic wave absorption structure, comprising:
    at least one electromagnetic wave composite absorbing layer,
    wherein the electromagnetic wave composite absorbing layer comprises a conductive composite layer and an insulating layer, and the insulating layer is stacked and overlapped with the conductive composite layer,
    wherein the conductive composite layer comprises a plurality of conductive layers and a plurality of interlayer insulating layers, and the conductive layers and the interlayer insulating layers are stacked in a staggered manner,
    wherein the conductive layer is a graphene layer, a graphite layer, a graphite nanoplatelet layer or a carbon nanotube layer, and
    wherein the interlayer insulating layer comprises epoxy resin mixed with boron nitride, the insulating layer comprises epoxy resin mixed with iron oxide.

12. The electromagnetic wave absorption structure of claim 11, wherein a thickness of the electromagnetic wave absorption structure is between 5 μm and 5000 μm.

13. The electromagnetic wave absorption structure of claim 11, wherein a thickness of the conductive composite layer is between 1 μm and 100 μm.

14. The electromagnetic wave absorption structure of claim 11, wherein a thickness of the insulating layer is between 0.1 μm and 200 μm.

15. The electromagnetic wave absorption structure of claim 11, wherein amounts of the conductive layers and the interlayer insulating layers in the conductive composite layer are different.

16. The electromagnetic wave absorption structure of claim 11, wherein a thickness of the conductive layer is between 5 nm and 200 nm.

17. The electromagnetic wave absorption structure of claim 11, wherein a thickness of the interlayer insulating layer is between 5 nm and 10000 nm.

18. The electromagnetic wave absorption structure of claim 11, wherein a sheet resistance of the conductive layer is between 10 ohm per square and 1000 ohm per square.

19. The electromagnetic wave absorption structure of claim 11, wherein the electromagnetic wave absorption structure comprises at least two electromagnetic wave composite absorbing layers stacked and overlapped with each other.

20. The electromagnetic wave absorption structure of claim 19, wherein amounts of the conductive layers and the interlayer insulating layers in the conductive composite layer are different.

* * * * *